US 11,887,766 B2

(12) United States Patent
Ramabhadran et al.

(10) Patent No.: US 11,887,766 B2
(45) Date of Patent: Jan. 30, 2024

(54) MAGNETIC COMPONENT AND METHOD OF FORMING

(71) Applicant: GE AVIATION SYSTEMS LLC, Grand Rapids, MI (US)

(72) Inventors: Ramanujam Ramabhadran, Jericho, NY (US); Ruxi Wang, Cohoes, NY (US); Juan Manuel Rivas Davila, Palo Alto, CA (US); Jiale Xu, Sunnyvale, CA (US)

(73) Assignee: GE Aviation Systems LLC, Grand Rapids, MI (US)

( * ) Notice: Subject to any disclaimer, the term of this patent is extended or adjusted under 35 U.S.C. 154(b) by 501 days.

(21) Appl. No.: 17/001,171

(22) Filed: Aug. 24, 2020

(65) Prior Publication Data
US 2022/0059272 A1 Feb. 24, 2022

(51) Int. Cl.
| | |
|---|---|
| *B23K 1/00* | (2006.01) |
| *H01F 27/08* | (2006.01) |
| *B33Y 80/00* | (2015.01) |
| *H01F 27/245* | (2006.01) |
| *H01F 41/02* | (2006.01) |
| *H05K 1/18* | (2006.01) |
| *H05K 3/34* | (2006.01) |
| *B33Y 10/00* | (2015.01) |

(Continued)

(52) U.S. Cl.
CPC ............ *H01F 27/08* (2013.01); *B23K 1/0016* (2013.01); *B33Y 80/00* (2014.12); *H01F 27/245* (2013.01); *H01F 41/0233* (2013.01); *H05K 1/181* (2013.01); *H05K 3/341* (2013.01); *B23K 2101/42* (2018.08); *B23K 2103/02* (2018.08); *B33Y 10/00* (2014.12); *H05K 2201/1003* (2013.01)

(58) Field of Classification Search
CPC .... H01F 27/266; H01F 41/0206; H01F 27/10; H01F 3/00; H01F 17/04; H01F 27/24; H01F 41/02; H01F 27/08; H01F 27/245; H01F 41/0233; H01F 2027/065; H01F 3/08; H01F 27/20; B23K 1/0016; B23K 2101/36–42; B23K 2103/02; B23K 1/008; B23K 26/342; B33Y 80/00; B33Y 10/00; H05K 1/181; H05K 3/341; H05K 2201/1003; B22F 2999/00; B22F 5/10; B22F 7/06; Y02P 10/25
USPC .......................... 228/179.1–180.22, 245–262
See application file for complete search history.

(56) References Cited

U.S. PATENT DOCUMENTS

| | | | | |
|---|---|---|---|---|
| 4,938,816 A | * | 7/1990 | Beaman ................... | B22F 7/02 264/435 |
| 5,053,090 A | * | 10/1991 | Beaman ................. | B23K 26/34 425/174 |

(Continued)

FOREIGN PATENT DOCUMENTS

| | | | | |
|---|---|---|---|---|
| CN | 103551690 A | * | 2/2014 | ............ B23K 1/008 |
| CN | 104465078 A | * | 3/2015 | ............ H01C 1/148 |

(Continued)

*Primary Examiner* — Kiley S Stoner
(74) *Attorney, Agent, or Firm* — McGarry Bair PC (57) ABSTRACT

A component includes a magnetic core having a body formed of a first material, defining a first opening and a second opening thereon. A duct formed of a second material extends at least partially through the body between the first opening and the second opening. The first opening and the second opening are in fluid communication by way of the duct.

10 Claims, 3 Drawing Sheets

(51) Int. Cl.
*B23K 101/42* (2006.01)
*B23K 103/02* (2006.01)

(56) References Cited

U.S. PATENT DOCUMENTS

| | | | |
|---|---|---|---|
| 5,083,101 A | 1/1992 | Frederick | |
| 6,515,566 B1 | 2/2003 | Toi et al. | |
| 8,344,842 B1* | 1/2013 | Luzanov | H01F 41/02 |
| | | | 336/192 |
| 9,373,436 B2 | 6/2016 | Pal | |
| 2005/0012585 A1* | 1/2005 | Moncada | H01F 27/306 |
| | | | 336/184 |
| 2011/0174525 A1* | 7/2011 | Conrad | H05K 3/3485 |
| | | | 228/256 |
| 2012/0139683 A1 | 6/2012 | Salomäki | |
| 2013/0170171 A1 | 7/2013 | Wicker et al. | |
| 2014/0131908 A1* | 5/2014 | Sun | B33Y 80/00 |
| | | | 264/16 |
| 2017/0360534 A1* | 12/2017 | Sun | B33Y 70/10 |
| 2018/0000570 A1* | 1/2018 | Sun | A61C 13/08 |
| 2018/0154580 A1* | 6/2018 | Mark | B22F 3/24 |
| 2019/0125503 A1* | 5/2019 | Krolikowski | B33Y 70/00 |
| 2019/0210294 A1* | 7/2019 | Hudelson | B33Y 30/00 |
| 2019/0255612 A1* | 8/2019 | Mark | C04B 35/638 |
| 2019/0270254 A1* | 9/2019 | Mark | B29C 64/118 |
| 2019/0311852 A1 | 10/2019 | Johnson et al. | |
| 2019/0333676 A1 | 10/2019 | Shin et al. | |
| 2019/0378643 A1* | 12/2019 | Zhou | H01F 27/2823 |
| 2020/0036118 A1* | 1/2020 | Su | H01G 4/228 |
| 2020/0105453 A1 | 4/2020 | Yan et al. | |
| 2020/0114640 A1 | 4/2020 | Wang et al. | |
| 2020/0139621 A1* | 5/2020 | Gatrell | G01N 1/28 |
| 2020/0261191 A1* | 8/2020 | Zenou | A61C 13/0018 |
| 2021/0268728 A1* | 9/2021 | Saito | B33Y 10/00 |
| 2021/0268732 A1* | 9/2021 | Lee | B29C 64/165 |

FOREIGN PATENT DOCUMENTS

| | | | | |
|---|---|---|---|---|
| CN | 209843434 U | * | 12/2019 | |
| EP | 0282646 B1 | | 3/1993 | |
| EP | 0459326 B1 | | 5/1995 | |
| JP | 2020057788 A | * | 4/2020 | H01F 27/2804 |
| WO | WO-2015164552 A1 | * | 10/2015 | B33Y 80/00 |
| WO | WO-2018209029 A1 | * | 11/2018 | B22F 10/10 |
| WO | WO-2019226815 A1 | * | 11/2019 | B22F 10/10 |
| WO | WO-2020081561 A1 | * | 4/2020 | A61J 1/035 |

* cited by examiner

MAGNETIC COMPONENT AND METHOD OF FORMING

STATEMENT REGARDING FEDERALLY SPONSORED RESEARCH OR DEVELOPMENT

This invention was made with government support under Contract No. DE-EE0007629 awarded by the Department of Energy. The government has certain rights in the invention.

TECHNICAL FIELD

The disclosure relates to a magnetic device and method. More specifically to additive manufacturing process to manufacture a magnetic component having integrated cooling channels therein.

BACKGROUND

Electrical and magnetic components, such as inductors and transformers, are well known and can be used for a wide variety of purposes such as to magnetically couple electrical circuits and provide for electromagnetic filtering. For example, inductors are often used in alternating current (AC) electronic equipment to block AC signals while allowing direct current (DC) to pass (e.g., a choke). Inductors are also used as electronic filters to separate signals of different frequencies, and in combination with capacitors in tuned circuits.

Conventional inductors include windings (for example, a coil) wrapped around a magnetic core, and store energy in a magnetic field when an electric current flows through the coil windings. When the current flowing through the inductor changes, the magnetic field is generated which induces an electromotive force (i.e., a voltage) in the windings.

The magnetic core is typically formed of iron or ferrite. Due to their high magnetic permeability, such cores provide an increased magnetic field and thereby significantly increase the inductance (i.e., the ratio of the voltage to the rate of change of current through the coil) of the inductor. However, the magnetic properties of the core material can cause energy losses in the core material, due to eddy currents and hysteresis loops, that are dissipated as heat.

Inductors are often soldered as surface mounted components on a conventional printed circuit board (PCB) as part of a circuit. For example, conventional circuit boards often use a reflow soldering process to melt a solder material, such as a solder in the form of a paste, to attach surface mount components to printed circuit boards. Reflow soldering forms solder joints by first pre-heating the components, PCB, and solder material and then increasing the heat to a temperature (for example 240-250 degrees Celsius (° C.)) sufficient to melt the solder material for a predetermined period (for example 8-10 seconds) without causing damage to the components or PCB by overheating. Additionally, high temperatures (for example, above 260° C.) may cause damage to the electronic components on the printed circuit board.

Reflow soldering uses a solder material such as a solder paste (e.g., a mixture of a powdered solder alloy and flux) to temporarily attach the inductor and other circuit components to respective contact pads disposed on the printed circuit board. The entire assembly is then subjected to an elevated temperature (for example, by passing the assembly through a reflow oven or under an infrared lamp) to cause the solder material to "reflow" (i.e., in a molten state). Typically, the assembly (i.e., the PCB with mounted components) is heated at least to the eutectic temperature of the solder material, causing the solder alloy to undergo a phase change from a solid to a liquid or molten state having properties of adhesion. The solder material thereby enables permanent solder joints between the surface mounted components and the respective contact pads after the assembly cools and the solder alloy solidifies from the molten state. Typically, a reflow soldering process comprises multiple heating stages, with each stage comprising a predetermined maximum temperature and duration. For example, four heating stages (or "zones") can he employed, each heating stage defining a distinct thermal profile commonly referred to as a preheat, thermal soak, reflow, and cooling stage.

BRIEF DESCRIPTION

In one aspect, the present disclosure relates to a component having a magnetic core. The magnetic core includes a body formed of a first material, defining a first opening and a second opening thereon. The magnetic core further includes a duct formed of a second material extending at least partially through the body between the first inlet opening and the second outlet opening, the first inlet opening and the second outlet opening being in fluid communication by way of the duct.

In yet another aspect, the present disclosure relates to a method of manufacturing a component having a body. The method includes printing the body via a layer-by-layer process, including heating each printed layer of the body except the last printed layer of the body. The method further includes coupling the body to a PCB, applying a solder material to the PCB, and coupling the component to the PCB via a reflow soldering process.

These and other features, aspects and advantages of the present disclosure will become better understood with reference to the following description and appended claims. The accompanying drawings, which are incorporated in and constitute a part of this specification, illustrate aspects of the disclosure and, together with the description, explains the principles of the disclosure.

BRIEF DESCRIPTION OF THE DRAWINGS

A full and enabling disclosure of the present description, including the best mode thereof, directed to one of ordinary skill in the art, is set forth in the specification, which refers to the appended FIGS., in which.

DETAILED DESCRIPTION

As used herein, the term "set" or a "set" of elements can be any number of elements, including only one. As used herein, the terms "axial" or "axially" refer to a dimension along a component. Additionally, as used herein, the terms "radial" or "radially" refer to a direction away from a common center. For example, in the overall context of a cylindrical component, radial refers to a direction along a ray extending between a center longitudinal axis and an outer circumference. As used herein, the term "helix" or "helically" refer to a direction in the shape of a helix or a spiral around a center longitudinal axis.

All directional references (e.g., radial, axial, upper, lower, upward, downward, left, right, lateral, front, back, top, bottom, above, below, vertical, horizontal, clockwise, counterclockwise, inboard, outboard) are only used for identification purposes to aid the reader's understanding of the disclosure, and do not create limitations, particularly as to the position, orientation, or use thereof. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other.

As used in the specification and the appended claims, the singular forms "a," "an," and "the" include plural referents unless the context clearly dictates otherwise. The use of the term "about" in conjunction with a numerical value refers to within 25% of the stated amount.

As used herein the term "reflow" is used to refer to a temperature above which a solid mass of solder alloy is certain to melt (as opposed to merely soften). When cooled below this temperature, the solder will not flow, and when heated above it once more, the solder will flow again.

Reference now will be made in detail to aspects, one or more examples of which are illustrated in the drawings. Each example is provided by way of explanation of the aspects, not limitation of the aspects. In fact, it will be apparent to those skilled in the art that various modifications and variations can be made in the present disclosure without departing from the scope or spirit of the disclosure. For instance, features illustrated or described as part of one aspect can be used with another aspect to yield a still further aspect. Thus, it is intended that the present disclosure covers such modifications and variations as come within the scope of the appended claims and their equivalents.

In accordance with example aspects of the present disclosure, various components can be formed or "printed" using an additive-manufacturing process, such as a three-dimensional (3-D) printing process. The use of such a process can allow the components to be formed integrally, as a single monolithic component, or as any suitable number of sub-components. The manufacturing process can allow these components to be integrally formed and include a variety of features not possible when using prior manufacturing methods.

As used herein, the terms "additively manufactured" or "additive manufacturing techniques or processes" refer generally to manufacturing processes wherein successive layers of material(s) are provided on each other to "build-up", layer-by-layer, a 3-D component. The successive layers generally fuse together to form a monolithic unitary component, which can have a variety of integral sub-components. Monolithic, as used herein, refers to a unitary structure lacking interfaces or joints by virtue of the materials of each layer fusing to or melting with the materials of adjacent layers such that the individual layers lose their identity in the final unitary structure. In some aspects, the successive layers generally fuse together to form a monolithic component which can have a variety of integral sub-components. Although additive manufacturing technology is described herein as providing for the fabrication of complex objects by building objects point-by-point, layer-by-layer, typically in a vertical direction, other methods of fabrication are possible and within the scope of the present disclosure. For example, although the discussion herein refers to the addition of material to form successive layers, one skilled in the art will appreciate that the methods and structures disclosed herein can be practiced with any additive manufacturing technique or manufacturing technology. For example, aspects of the present disclosure can use layer-additive processes, layer-subtractive processes, or hybrid processes.

Suitable additive manufacturing techniques in accordance with the present disclosure include, for example, Fused Deposition Modeling (FDM), Selective Laser Sintering (SLS), 3-D printing such as by inkjets and laserjets, stereolithography (SLA), Direct Selective Laser Sintering (DSLS), Electron Beam Sintering (EBS), Electron Beam Melting (EBM), Laser Engineered Net Shaping (LENS), Laser Net Shape Manufacturing (LNSM), Direct Metal Deposition (DMD), Digital Light Processing (DLP), Direct Metal Laser Sintering (DMLS), and Binder Jet Additive manufacturing (BJAM), and other known processes. For ease of description and understanding, the disclosure herein will be discussed with respect to printing using a BJAM process, but aspects are not so limited. Aspects can incorporate any desired 3-D printing methodology without departing from the scope of the disclosure.

The additive manufacturing processes described herein can be used for forming components using any suitable material or set of materials. More specifically, according to example aspects, the components described herein can be formed in part, in whole, or in some combination of materials including but not limited to magnetic materials such as ferrites, and thermally conductive, electrically insulative materials such as aluminum nitride, and can further include other materials such as binders.

One skilled in the art will appreciate that a variety of materials and methods for bonding those materials together can be used and are contemplated as within the scope of the present disclosure. As used herein, references to "fusing" can refer to any suitable process for creating a bonded layer of any of the above materials. For example, if the material is a powdered metal, the bond can be formed by a melting process. One skilled in the art will appreciate that other methods of fusing materials to make a component by additive manufacturing are possible, and the presently disclosed subject matter can be practiced with those methods.

In addition, the additive manufacturing process disclosed herein allows a single component to be formed from multiple materials. Thus, the components described herein can be formed from any suitable mixtures of the above materials. For example, a component can include multiple layers, segments, or parts that are formed using different materials, processes, or on different additive manufacturing machines. In this manner, components can be constructed which have different materials and material properties for meeting the demands of any application.

Figure 1:
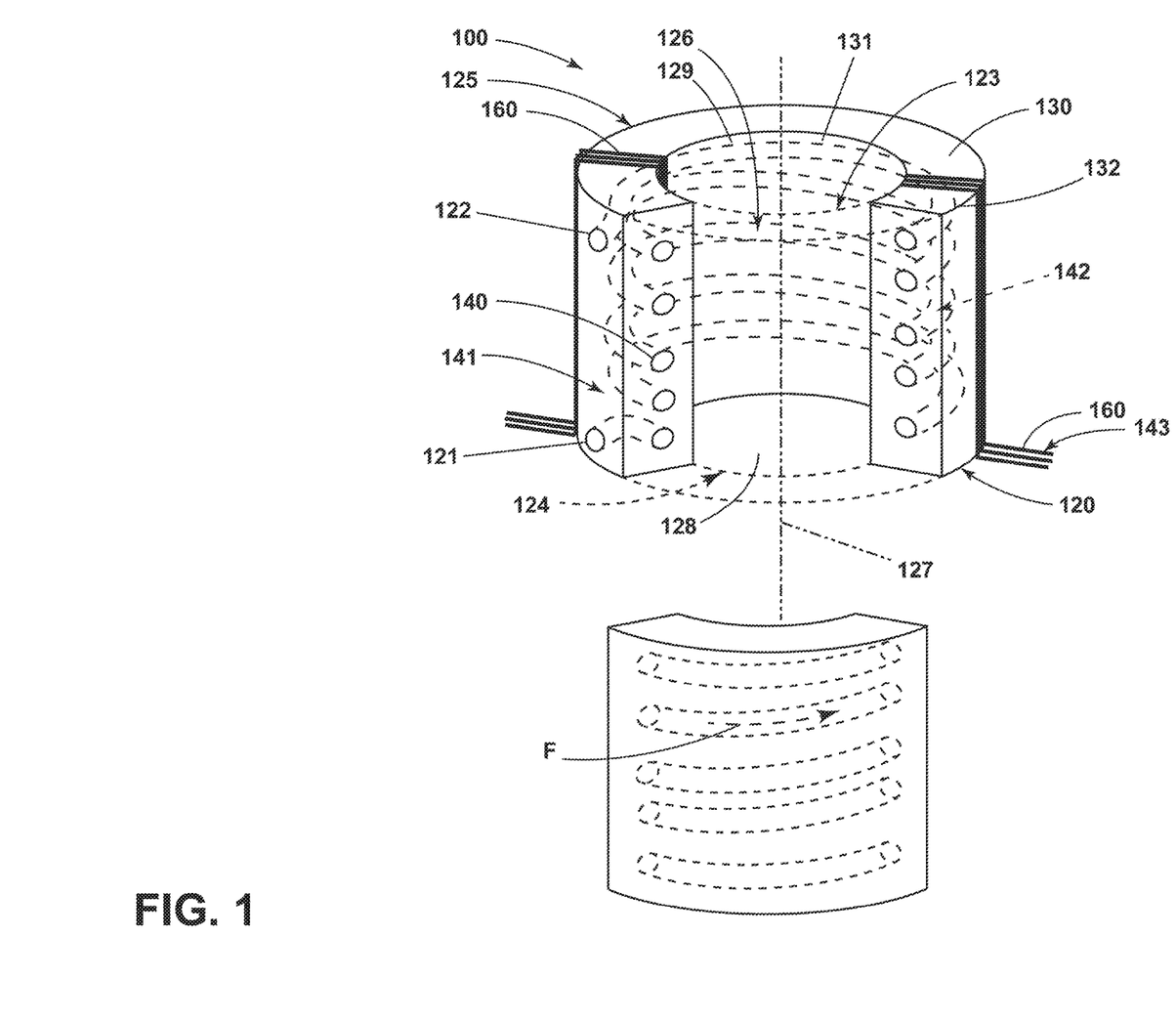
FIG. 1 illustrates an example isometric view of a component in accordance with various aspects described herein.

With reference to FIG. 1, non-limiting aspects of a component 100 (for example, an inductor or inductive component) is shown in a cross-sectional perspective view. While aspects of the component 100 can include a generally contiguous composition, a fore portion of the component 100, in the perspective of FIG.1, has been illustrated schematically removed, for understanding. The component 100 includes a magnetic core 120 comprising a body 125. The body 125 can include a wall 130 that includes an exterior or outboard surface 132. In one non-limiting example, the outboard surface 132 can include at least an outer circumferential surface of a generally cylindrical or toroidal component 100 or magnetic core 120. In some aspects, the wall 130 can include an opposing inboard surface 131. The body 125 further includes a first opening 121, and a second opening 122 defined on the outboard surface 132. The magnetic core 120 further includes a duct 140 (shown in phantom lines, for understanding) extending between, and in fluid communication with, the first opening 121 and the second opening 122. While a "duct" 140 is described, those in art will recognize the flow-through between the first opening 121 and the second opening 122 can include a passage, passageway, channel, tube, flow pathway, or the like. In non-limiting aspects, the component 100 can optionally include a set of windings 160 (e.g., conductive windings). In other aspects, the component 100 can omit the set of windings 160. The body 125 of magnetic core 120 can define an axial bore 123 such as a cavity therein. The axial bore 123 can define a centerline 127 therethrough. The axial bore 123 can comprise a first end 124 and a second end 126 opposite the first end 124.

The component 100 can be printed according to example aspects of the present disclosure. In example aspects, the body 125 can be printed layer-by-layer perpendicular to the centerline 127 through the axial bore 123. In some aspects, the body 125 can be printed to define the axial bore 123 having an opening 128 at the first end 124 of the axial bore 123. In other aspects, the body 125 can be printed to define the axial bore 123 having a second opening 129 at the second end 126 of the axial bore 123. In still other aspects, the axial bore 123 can be open at both the first end 124 and the second end 126 of the body 125, the second end 126 being spaced from the first end 124. In an aspect, first end 124 and second end 126 of the axial bore 123 are at distal or opposing ends of the body 125.

As illustrated, the wall 130 can be a perimeter wall, comprising inboard surface 131 and the opposing outboard surface 132. The inboard surface 131 of the wall 130 can at least partially define the axial bore 123. The outboard surface 132 (e.g., the outer surface of the body 125) is oppositely spaced from the inboard surface 131 in a radial direction, relative to the centerline 127. In an aspect, the outboard surface 132 is an exterior surface of the body 125. The wall 130 can enclose the duct 140 therein, i.e., the duct 140 can be embedded between the inboard surface 131 and the outboard surface 132.

While the aspect of FIG. 1 is depicted and described with the magnetic core 120 having a body 125 that, for example, is substantially toroidal, other aspects are not so limited, and can comprise any desired shape or geometry, with or without an axial bore 123, having any number of inboard and outboard surfaces 131, 132 without departing from the scope of the disclosure. In aspects, the body 125 is formed (for example, by 3-D printing) from a first material 141 having ferrimagnetic properties, such as iron or ferrite. For example, in various aspects, the first material 141 can comprise manganese-zinc ferrite or nickel-zinc ferrite. In non-limiting aspects, the first material 141 can comprise a nano-crystalline structure. Other aspects are not so limited and the first material 141 can comprise any desired magnetic material without departing from the scope of the disclosure.

In non-limiting aspects of the disclosure, the magnetic core 120 can additionally comprise the duct 140, such as a coolant channel, disposed therethrough. The duct 140 can be coupled in fluid communication with the first opening 121 and the second opening 122 and thus cooperatively define a continuous channel or conduit within the body 125 operable to provide a flow path for a fluid coolant (designated herein as "F", and indicated in the Figures by an arrow, designated "F") to flow therethrough from the first opening 121 through the duct 140 to the second opening 122. Accordingly, in aspects, the first opening 121 can be arranged as an inlet aperture, and the second opening 122 can be arranged as an outlet aperture with respect to a flow of the fluid coolant F.

The duct 140 can be formed (for example, by 3-D printing) using a second material 142, such as by forming the walls of the duct 140. In some aspects, the second material 142 can be the same as the first material 141. In other aspects, the second material 142 can be different from the first material 141. For example, in non-limiting aspects, the second material 142 can be electrically insulative and thermally conductive. As used herein "electrically insulative" refers to an inherent property of a material that generally exhibits a low electrical conductivity (for example, less than about $10^{-8}$ siemens per meter (S/m)). Also, as used herein, "thermally conductive" refers to an inherent property of a material that generally exhibits a high thermal conductivity (for example, greater than about 1 watt per meter-Kelvin (W/mK).

In one non-limiting aspect, the second material 142 can comprise a mixture of aluminum oxide and titanium carbide composites. In other aspects, the material can comprise a mixture of aluminum oxide and zirconium dioxide. In some aspects, the second material 142 can be a ceramic material. For example, the second material 142 can include, without limitation aluminum oxide ($Al_2O_3$), silicon carbide (SiC), silicon dioxide ($SiO_2$), magnesium oxide (MgO), zirconium dioxide ($ZrO_2$), yttria stabilized zirconia (YSZ), Silicon Nitride ($Si_3N_4$), aluminum nitride (AlN), boron carbide ($B_4C$), and boron nitride (BN), individually, or in various combinations thereof. Additionally, the second material 142 can comprise any of glass and glass ceramics, such as Borosilicate glass, quartz, alumino-silicates, silicate ceramics, or magnesium silicates individually, or in various combinations thereof. In still other non-limiting aspects, the second material 142 can include non-binary ceramics such as aluminum titanate ($Al_2TiO_5$), barium titanate ($BaTiO_3$), or zirconium titanate ($ZrTiO_4$) individually, or in various combinations thereof. In yet other non-limiting aspects, the second material 142 can include conductive ceramics such as carbides, borides, nitrides, silicides of d-block elements, including for example, titanium oxides ($TiO_x$, where x<1), titanium carbides ($TiC_x$), titanium nitrides ($TiN_x$), titanium boride ($TiB_2$), zirconium diboride ($ZrB_2$), hafnium diboride ($HfB_2$), tungsten carbide (WC), molybdenum disilicide ($MoSi_2$).

Moreover, to enhance the wettability or bonding ability of such insulative materials (i.e., to the first material 141), at least one of the first material 141 and the second material 142 can further optionally comprise a reactive element. For example, in a non-limiting aspect, the reactive element can comprise any of chromium (Cr), titanium (Ti), zirconium (Zr), hafnium (Hf), vanadium (V), or palladium (Pd), individually, or in various combinations thereof. In an aspect, the reactive metal can be pre-mixed or otherwise included with the first material 141 when printing the body 125. In other aspects, the reactive element can be deposited on one of the first material 141 or the second material 142 through any number of conventional deposition techniques such as sputter deposition or physical vapor deposition. The reactive element is operable to react and bond with the second material 142 and the first material 141.

The set of windings 160 can be formed (for example, by 3-D printing) using a third material 143. The third material 143 can be a conductive material such as copper or aluminum. The set of windings 160 can comprise an electrically conductive wire 161 or cable helically wrapped around a portion of the magnetic core 110. The set of windings 160 can comprise any desired number of turns or wraps, including only one. The set of windings 160 can comprise any desired number of windings 160, including only one. The conductive wire 161 can optionally include an insulative portion 162 thereon. The insulative portion 162 can comprise a fourth material such as an electrically insulative material.

In some non-limiting aspects, the set of windings 160 can be formed using a 3-D printing process, such as a BJAM process. In other non-limiting aspects, the conductive wire 161 can be formed separately using any conventional wire forming technique, with or without an insulation portion 162, and wrapped around the desired portion of the magnetic core 110.

In operation, a fluid coolant F, or a fluid coolant flow thereof, can enter the duct 140 by way of the first opening 121. For example, a pump can force the coolant fluid F from a coolant reservoir through a tube or hose that is coupled in fluid communication with the first opening 121. The fluid coolant F can then travel or flow through the duct 140 until it reaches the second opening 122 whereby it exits the duct 140 by flowing out of the second opening 122. For example, the fluid coolant F, under pressure from the pump can be forced out of second opening 122, and into a second tube or hose in fluid communication with second opening 122. The second hose can deliver the fluid coolant F to a sump or receptacle wherein it can be recycled by the pump back to the first opening 121 to repeat the operation. While the fluid coolant F travels or flows through duct 140, it absorbs heat from the magnetic core 110. While aspects of the disclosure are described as fluid coolant F flowing from the first opening 121 to the second opening 122, it will be understood that the fluid coolant F can be received in the opposing direction, as well, that is, from the second opening 122 to the first opening 121.

The duct 140 can be arranged to define any number of paths through the magnetic core 110. For example, in some aspects, the duct 140 can extend helically (i.e., such that the fluid coolant F can travel helically through the duct 140). In other aspects, the duct 140 can extend axially (i.e., such that the fluid coolant F can travel axially through the duct 140). In other aspects, the duct 140 can extend radially (i.e., such that the fluid coolant F can travel radially inward or outward through the duct 140). In still other aspects, as depicted in FIG. 1, the duct 140 can extend through the magnetic core 110 any of helically, axially, radially, or in any combination thereof. It will be appreciated that other aspects of the magnetic core 110 are not so limited, and the duct 140 can be arranged to define any number or combination of orientations or coolant fluid F flow paths within the wall 130 therethrough without departing from the scope of the disclosure. The wall 130 of the magnetic core 110 thus defines a duct 140 integrally formed and operable to enable a coolant fluid F to flow therethrough.

Figure 2:
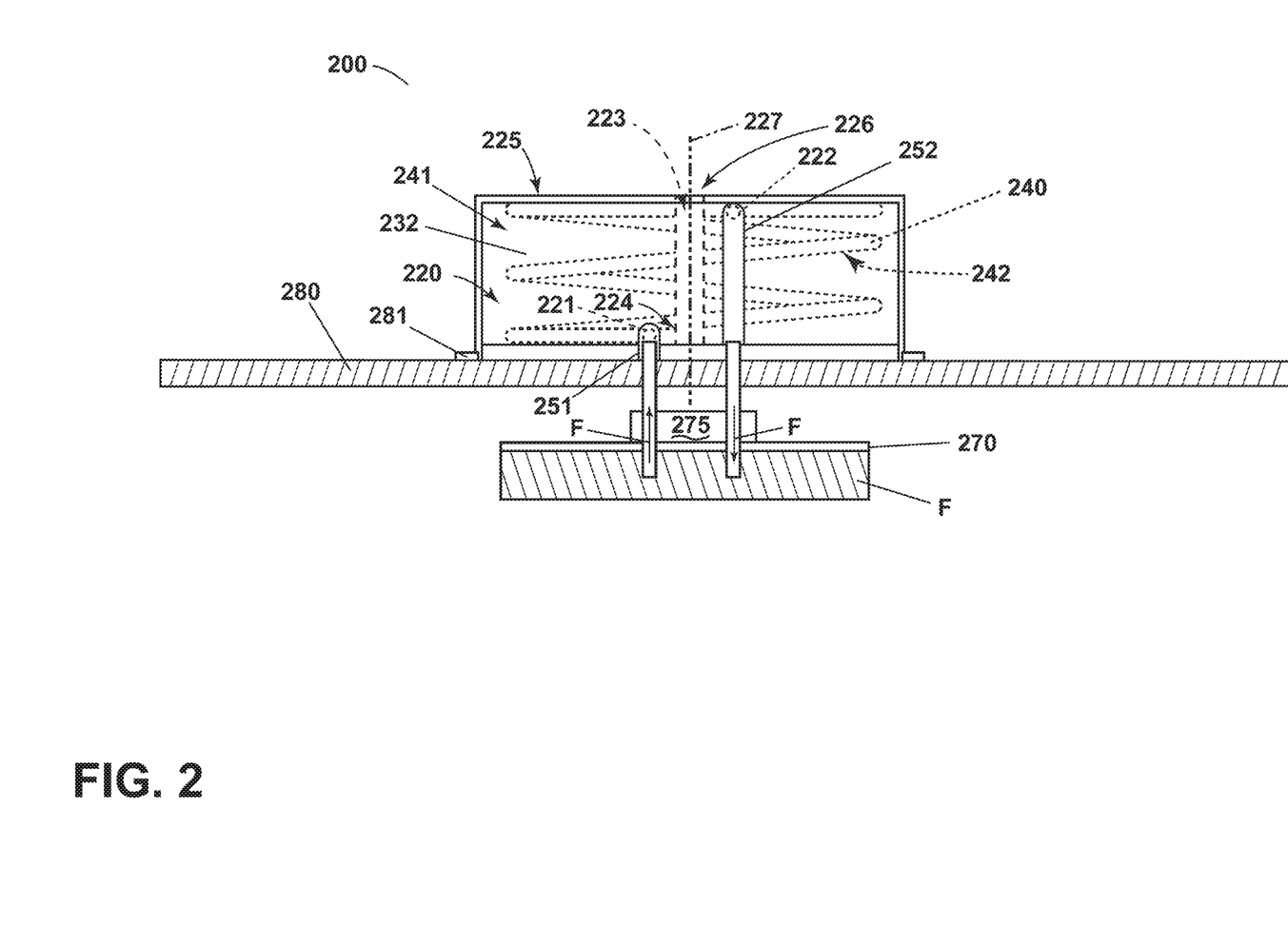
FIG. 2 illustrates an example cross-sectional view of another component in accordance with various aspects described herein.

With reference to FIG. 2 another non-limiting aspect of the inductive component 100 is schematically illustrated. Therefore, like parts will be identified with the same reference number as FIG. 1, but increased to 200. One difference is that the aspect of FIG. 2 is shown coupled to a PCB 280. Another difference is that aspects of the disclosure included in FIG. 2 can include for example, a sump portion 270 and an external pump 275. The sump portion 270 and external pump 275 can be arranged in fluid communication with a feed line 251 and a return line 252 to provide a fluid coolant F to the component 200.

The component 200 includes a magnetic core 220 comprising a body 225. The body 225 can include a wall 230 that includes an outboard surface 232. The body 225 further includes a first opening 221, and a second opening 222 defined on the outboard surface 232. The body 225 further includes a duct 240 extending between, and in fluid communication with, the first opening 221 and the second opening 222. In non-limiting aspects, the component 200 can optionally include a set of windings (not shown). In other aspects, the component 200 can omit the set of windings. The body 225 of magnetic core 220 can define an axial bore 223 such as a cavity therein. The axial bore 123 can define a centerline 227 therethrough. The axial bore 223 can comprise a first end 224 and a second end 226 opposite the first end 224.

The component 200 can be printed according to example aspects of the present disclosure. In example aspects, the body 225 can be printed layer-by-layer perpendicular to the centerline 127 through the axial bore 223. In some aspects, the body 225 can be printed to define the axial bore 223 having an opening 228 at the first end 224 of the axial bore 123. In aspects, the body 225 is formed (for example, by 3-D printing) from a first material 241 having ferrimagnetic properties, such as iron or ferrite. For example, in various aspects, the first material 241 can comprise manganese-zinc ferrite or nickel-zinc ferrite. In non-limiting aspects, the first material 241 can comprise a nano-crystalline structure. Other aspects are not so limited and the first material 241 can comprise any desired magnetic material without departing from the scope of the disclosure.

The duct 240 can be formed (for example, by 3-D printing) using a second material 242, such as by forming the walls of the duct 240. In some aspects, the second material 242 can be the same as the first material 241. In other aspects, the second material 242 can be different from the first material 241. For example, in non-limiting aspects, the second material 142 can be electrically insulative and thermally conductive, as described hereinabove with respect to FIG. 1.

As shown, the component 200 can be coupled to a PCB 280. In aspects, the component can 200 can be coupled to the PCB 280 using solder 281, such as a solder material. In other aspects, the component 200 can be coupled to the PCB 280 using mechanical fasteners (not shown) such as screws or rivets.

In some aspects, the component 200 can additionally include the sump portion 270 or reservoir for the fluid coolant F. In such aspects, the sump portion 270 can be in fluid communication with the duct 240. In an aspect, the pump 275 (for example, a diaphragm-type pump) can be arranged to pump or force the fluid coolant F into the feed line 251 wherein the feed line 251 is coupled in fluid communication with the duct 240. The return line 252 can be coupled in fluid communication with the duct 240 to provide a return path for the fluid coolant F to return to the sump portion 270.

It is further contemplated that the fluid coolant F can comprise, in various aspects, a liquid. In other aspects the fluid coolant can comprise a gas. In some non-limiting aspects, the fluid coolant can be pressurized. In an aspect, the fluid coolant can be pressurized above atmospheric pressure using the pump 275. For example, aspects used in aviation or high-altitude applications can employ a pressurized gas as the fluid coolant F.

As noted above, aspects of the present disclosure can be additively manufactured or "3-D printed". As used herein, use of the term "printed" or "printing" refers to, for instance, manufacturing processes wherein successive layers of material(s) are provided on each other to "build-up", layer-by-layer, a 3-D component, as explained herein. For example, various aspects can be formed using an additive manufacturing process such as a BJAM process. However, aspects as disclosed herein further include an improved method of manufacturing a component.

Typically, conventional BJAM process, fabricate components using 3-D information, for example a 3-D computer model, of the component. Accordingly, a 3-D design model of the component can be defined prior to manufacturing. In this regard, a model or prototype of the component can be scanned to determine the 3-D information of the component. As another example, a model of the component can be constructed using a suitable computer aided design (CAD) program to define the 3-D design model of the component.

The design model can include 3-D numeric coordinates of the entire configuration of the component including both external and internal surfaces of the component. For example, the design model can define the body, the component base, the surface, the duct, or any surface features such as irregularities or datum features, as well as internal passageways, openings, support structures, etc. In one example aspect, the 3-D design model is converted into a plurality of slices or segments, e.g., along a central (e.g., vertical) axis of the component or any other suitable axis. Each slice can define a two-dimensional (2-D) cross section of the component for a predetermined height of the slice. The plurality of successive 2-D cross-sectional slices together form the 3-D component. The component is then "built-up" slice-by-slice, or layer-by-layer, until finished.

In this manner, the aspects described herein can be fabricated from a first and a second material in the form of a powder using a 3-D printing process. For example, an improved BJAM process can be used, in which any or all of the first, second, and third material are deposited in specific locations on sequential layers as determined by the 3-D model. Following the deposit of each layer, a liquid binder material is selectively deposited on the layer of powdered first, second, or third material using an ink-jet printing technique in cooperation with the computer 3-D model. The deposited binder is cured by heating (for example by an ultraviolet light) to bind the deposited powder into the geometry defined by the computer model. Following the sequential deposition of all the required powder layers and the binder material to form the component, any unbound powder can be removed, resulting in the formation of the desired component. Typically, the formed part is heated (for example, in a furnace) to burn or evaporate the binder out. In non-limiting aspects, the heating can comprise a high-temperature sintering well above a maximum reflow soldering temperature (e.g., greater than 1000 degrees Celsius) to sinter or coalesce the powder particles together into a solid mass without liquefaction. However, as will be described in more detail herein, in various non-limiting aspects, the final heating or sinter step can be omitted.

Each successive layer can be, for example, between about 0.25 mil and 200 mil, although the thickness can be selected based on any number of parameters and can be any suitable size according to alternative aspects. Therefore, utilizing the additive formation methods described above, the components described herein can have cross sections as thin as one thickness of an associated powder layer, e.g., 10 mil, utilized during the additive formation process.

In addition, utilizing an additive process, the surface finish and features of the components can vary as needed depending on the application. For example, the surface finish can be adjusted (e.g., made smoother or rougher) by selecting appropriate laser parameters during the additive process. A rougher finish can be achieved by increasing laser scan speed or a thickness of the powder layer, and a smoother finish can be achieved by decreasing laser scan speed or the thickness of the powder layer. The scanning pattern or laser power can also be changed to change the surface finish in a selected area of the components.

Figure 3:
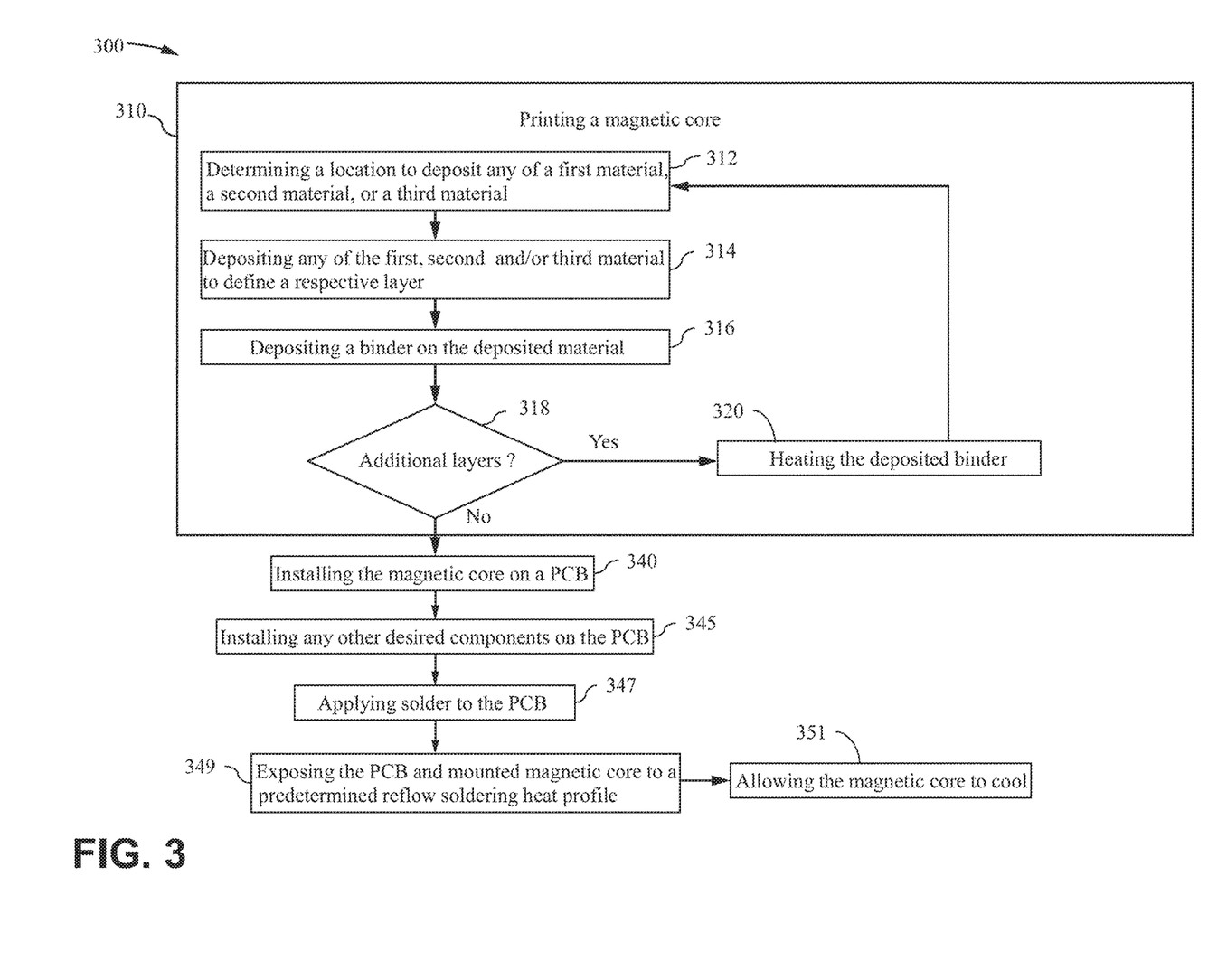
FIG. 3 illustrates an exemplary method flow diagram of a method of forming a component, in accordance with various aspects described herein.

With reference to FIG. 3, a flow diagram of a method 300 of manufacturing the magnetic core according to example aspects of the present disclosure is depicted. The steps are shown in FIG. 3 as performed in a particular order for purposes of illustration and discussion. Those of ordinary skill in the art, using the disclosures provided herein, will understand that the steps of any of the methods disclosed herein can be adapted, expanded, include sub-steps, modified, omitted, performed simultaneously, or rearranged in various ways without deviating from the scope of the present disclosure.

The method 300 generally includes printing, for example, via a BJAM printing process, a magnetic core, at 310. The BJAM printing process can include determining a location on each printed layer to deposit a respective first material, a second material, or a third material, or any combination of the first, second and third material, at 312. The method 300 includes depositing the first, second, third material, or any combination thereof, at the determined locations via a BJAM printing process to define a respective layer, at 314. After each respective layer is deposited, the method 300 includes depositing a binder material on the deposited material defining the respective layers, at 316. After the binder is deposited, the method 300 includes determining, at 318, whether there are additional layers to be deposited. In the event that an additional layer is to be deposited, the method 300 includes heating the deposited binder using heat, at 320. In some aspects, the heating can comprise sintering the deposited material. Once the deposited binder is heated at 320, the method 300 repeats the determining a location to deposit additional material, at 312, depositing the first, second, or third material or any combination thereof via a BJAM printing process to define another respective layer, at 314, and depositing the binder on the layer at 316. After the binder is deposited, at 316, the method 300 again includes determining, at 318, whether there are additional layers to be deposited. In the event it is determined, at 318, that no additional layers are to be deposited, the method 300 ceases the adding and heating the material via the BJAM printing process, that is, without applying heat in a final heating or sintering step.

The method 300 then continues by installing the printed magnetic core 110 on a PCB at 340, and optionally installing any other desired components on the PCB at 245 and applying solder 281 such as a solder material to the PCB, at 347. The method 300 includes exposing the PCB with mounted magnetic core 110, and any other desired components, to a predetermined reflow soldering heat profile, at 349. The method 300 concludes by allowing the PCB to cool after the reflow process, at 351.

The sequence depicted is for illustrative purposes only and is not meant to limit the method 300 in any way as it is understood that the portions of the method can proceed in a different logical order, additional or intervening portions can be included, or described portions of the method can be divided into multiple portions, or described portions of the method can be omitted without detracting from the described method.

Many other possible aspects and configurations in addition to that shown in the above figures are contemplated by the present disclosure.

The aspects disclosed herein provide a fluid coolant circuit in a housing for a component having an integral cooling duct. One advantage that can be realized in the above aspects is that the above described aspects have superior cooling capabilities compared with conventional devices. Additionally, the above aspects eliminate the need for a separate cooling device disposed external to the component. Additionally, aspects disclosed herein provide a method of forming a component via BJAM process that excludes a final heating step. One advantage that can be realized in the above aspects is that the above described aspects have reduced cost and time to manufacture the component.

To the extent not already described, the different features and structures of the various aspects can be used in combination with each other as desired. That one feature cannot be illustrated in all the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the disclosure, including the best mode, and to enable any person skilled in the art to practice aspects of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

The features disclosed in the foregoing description, in the following claims or in the accompanying drawings can, both separately and in any combination thereof, be material for realizing the disclosure in diverse forms thereof. Such other examples are intended to be within the scope of the claims if they have structural elements that do not differ from the literal language of the claims, or if they include equivalent structural elements with insubstantial differences from the literal languages of the claims.

Further aspects are provided by the subject matter of the following clauses:

A component comprising a magnetic core including: a body formed of a first material, defining a first opening and a second opening thereon; and a duct formed of a second material, extending at least partially through the body between the first inlet opening and the second outlet opening, the first inlet opening and the second outlet opening being in fluid communication by way of the duct.

The component of the preceding clause wherein duct defines a flow path for a fluid coolant.

The component of any preceding clause, wherein the first opening is an inlet for the fluid coolant, and second opening is an outlet for the fluid coolant.

The component of any preceding clause, further comprising the fluid coolant disposed in the duct.

The component of any preceding clause, wherein the first material is a ferritic material.

The component of any preceding clause, wherein the second material is thermally conductive and electrically insulative.

The component of any preceding clause, further comprising a set of windings arranged around a portion of the magnetic core.

The component of any preceding clause, wherein conductive windings are formed from an electrically conductive third material.

The component of any preceding clause, further comprising a sump portion.

The component of any preceding clause, wherein the sump portion is in fluid communication with the duct.

The component of any preceding clause, wherein a coolant fluid is disposed in the duct.

The component of any preceding clause, further comprising a pump in fluid communication with the duct, operable to pump the fluid through the duct.

A method of forming a component having a body, comprising: printing the body via a layer-by-layer process, including heating each printed layer of the body except the last printed layer of the body; coupling the body to a PCB; applying a solder material to the PCB; and coupling the component to the PCB via a reflow soldering process.

The method of the preceding clause, wherein the heating comprises sintering each printed layer of the body except the last printed layer of the body.

The method of any preceding clause, wherein the printing the body includes printing a magnetic core having a first opening and a second opening thereon; and printing a duct extending at least partially through the magnetic core between the first opening and the second opening, the first opening and the second opening being in fluid communication by way of the duct.

The method of any preceding clause, wherein the printing the body includes printing the magnetic core with a first material, and printing the duct with a second material.

The method of any preceding clause, wherein the first material is a ferritic material.

The method of any preceding clause, wherein the second material is a thermally conductive and electrically insulative material.

The method of any preceding clause, additionally comprising printing a set of windings arranged around a portion of the body.

The method of any preceding clause, wherein printing the set of winding includes printing the windings with a conductive third material.

What is claimed is:

1. A method of forming a component having a body, comprising:
   printing the body via a layer-by-layer process, except for the final layer of the body, including heating each printed layer;
   for the final layer of the body, depositing the final layer of the body without applying heat to the deposited final layer;
   coupling the body to a PCB;
   applying a solder material to the PCB; and
   coupling the component to the PCB via a reflow soldering process.

2. The method of claim 1, wherein the heating comprises sintering each printed layer of the body except the last printed layer of the body.

3. The method of claim 1, wherein the printing the body includes printing a magnetic core having a first opening and a second opening defined thereon; and
   printing a duct extending at least partially through the magnetic core between the first opening and the second opening, the first opening and the second opening being in fluid communication by way of the duct.

4. The method of claim 3, wherein the printing the body includes printing the magnetic core with a first material, and printing the duct with a second material.

5. The method of claim 4, wherein the first material is a ferritic material.

6. The method of claim 4, wherein the second material is a thermally conductive and electrically insulative material.

7. The method of claim 1, additionally comprising printing a set of windings arranged around a portion of the body.

8. The method of claim 7, wherein printing the set of windings includes printing the windings with a conductive third material.

9. The method of claim 1, wherein, for the final layer of the body, the depositing the final layer of the body without applying heat further comprises omitting a sintering step to sinter the deposited final layer of the body.

10. The method of claim 1, wherein, for the final layer of the body, the depositing the final layer of the body without applying heat further comprises leaving the deposited layer as an unbound powder layer.

\* \* \* \* \*